(12) United States Patent
Ozdemir et al.

(10) Patent No.: US 6,657,800 B1
(45) Date of Patent: Dec. 2, 2003

(54) VITERBI DETECTOR AND METHOD FOR RECOVERING A BINARY SEQUENCE FROM A READ SIGNAL

(75) Inventors: Hakan Ozdemir, San Jose, CA (US); Jason D. Byrne, Longmont, CA (US); Fereidoon Heydari, Cupertino, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 136 days.

(21) Appl. No.: 09/783,801

(22) Filed: Feb. 14, 2001

(51) Int. Cl.$^7$ .............................. G11B 5/09; H03M 13/03
(52) U.S. Cl. .............................. 360/40; 360/46; 360/48; 360/77.08; 714/794; 714/795
(58) Field of Search .............................. 360/40, 48, 44, 360/49, 77.88; 375/18, 34, 341

(56) References Cited

U.S. PATENT DOCUMENTS

| | | | |
|---|---|---|---|
| 4,644,564 A | * | 2/1987 | Dolivo et al. ............... 375/291 |
| 5,280,489 A | | 1/1994 | Fredrickson et al. |
| 5,418,657 A | | 5/1995 | Machado et al. |
| 5,661,760 A | * | 8/1997 | Patapoutian et al. ........ 375/341 |
| 5,923,713 A | * | 7/1999 | Hatakeyama ............... 375/341 |
| 5,963,386 A | | 10/1999 | Assouad |
| 5,995,308 A | | 11/1999 | Assouad et al. |
| 6,041,421 A | * | 3/2000 | Yamamoto ...................... 714/7 |
| 6,393,598 B1 | * | 5/2002 | Tsang et al. ................ 714/795 |

OTHER PUBLICATIONS

Collins O. M., et al. "Determinate State Convolutional Codes", IEEE Transactions on Communications, IEEE Inc., New York, US, vol. 41, No. 12, Dec. 01, 1993; pp. 1785–1794.

Nikolic B., et al., "Reduced–complexity Sequence Detection for EPR4 Magnetic Recording Channel", Seamless Interconnection for Universal Services, Global Telecommunications Conference–blogecom '99; vol. 1b, Sep. 05, 1999; pp. 960–964.

Cideciyan R. D., et al., "A PRML System for Digital Magnetic Recording", IEEE Journal on Selected Areas in Communications, IEEE, Inc., New York, US, vol. 10, No. 1, 1992, pp. 38–56.

* cited by examiner

*Primary Examiner*—Richemond Dorvil
*Assistant Examiner*—Natalia Figueroa
(74) *Attorney, Agent, or Firm*—Lisa K. Jorgenson; Bryan A. Santarelli (57) ABSTRACT

A Viterbi detector receives a signal that represents a binary sequence having groups of no more and no fewer than a predetermined number of consecutive bits each having a first logic level, where the groups are separated from each other by respective bits having a second logic level. The Viterbi detector recovers the binary sequence from the signal by calculating a respective path metric for each of no more than four possible states of the binary sequence, and determining a surviving path from the calculated path metrics, where the binary sequence lies along the surviving path. Or, the Viterbi detector recovers the binary sequence from the signal by calculating respective path metrics for possible states of the binary sequence, calculating multiple path metrics for no more than one of the possible states, and determining the surviving path from the calculated path metrics.

32 Claims, 11 Drawing Sheets

| UNCODED 4 BITS WORD | CODED PATTERN |
|---|---|
| 0000 | 001100110000 |
| 0001 | 001100110011 |
| 0010 | 001100000110 |
| 0011 | 001100000011 |
| 0100 | 000110001100 |
| 0101 | 000110011000 |
| 0110 | 001100001100 |
| 0111 | 001100011000 |
| 1000 | 000000110000 |
| 1001 | 000000110011 |
| 1010 | 000001100110 |
| 1011 | 000001100011 |
| 1100 | 000110000110 |
| 1101 | 000110000011 |
| 1110 | 000011000110 |
| 1111 | 000011000011 |

VITERBI DETECTOR AND METHOD FOR RECOVERING A BINARY SEQUENCE FROM A READ SIGNAL

CROSS-REFERENCE TO RELATED APPLICATIONS

This application is related to U.S. patent application Ser. No. 09/087,364, entitled "METHOD AND APPARATUS FOR READING AND WRITING GRAY CODE SERVO DATA TO A MAGNETIC MEDIUM USING SYNCHRONOUS DETECTION," which is incorporated by reference.

TECHNICAL FIELD OF THE INVENTION

The invention is related generally to electronic circuits, and more particularly to a Viterbi detector and technique for recovering a binary sequence from a read signal. In one embodiment, a servo channel includes a pruned PR4 Viterbi detector that recovers Gray coded servo data read from a data-storage disk. As compared to other servo channels, this PR4 targeted channel allows synchronous detection of the track ID information without oversampling, which allows a significant increase in the density of the servo data stored on the disk, and thus which allows a significant reduction in the disk area allocated to servo data. More specifically, constructing the servo channel to fit a target PR4 power spectrum (defined by a PR4 polynomial) allows the servo channel to perform a lower level of equalization on the servo signal. Lowering the level of equalization often lowers the level of equalization noise introduced into the servo signal, and thus causes less degradation of the servo signal's signal-to-noise ratio (SNR). Furthermore, the PR4 Viterbi detector is pruned to match a Gray code coding scheme. This pruning increases the minimum Euclidian distance of error events. Therefore, such a pruned PR4 Viterbi detector can often recover servo information from a servo signal having an SNR that is lower than other Viterbi detectors can tolerate. Consequently, because it can process a servo signal having a lower SNR and because it causes less degradation of the servo signal's SNR, such a servo channel allows a disk to have a higher servo-data storage density.

BACKGROUND OF THE INVENTION

Figure 1:
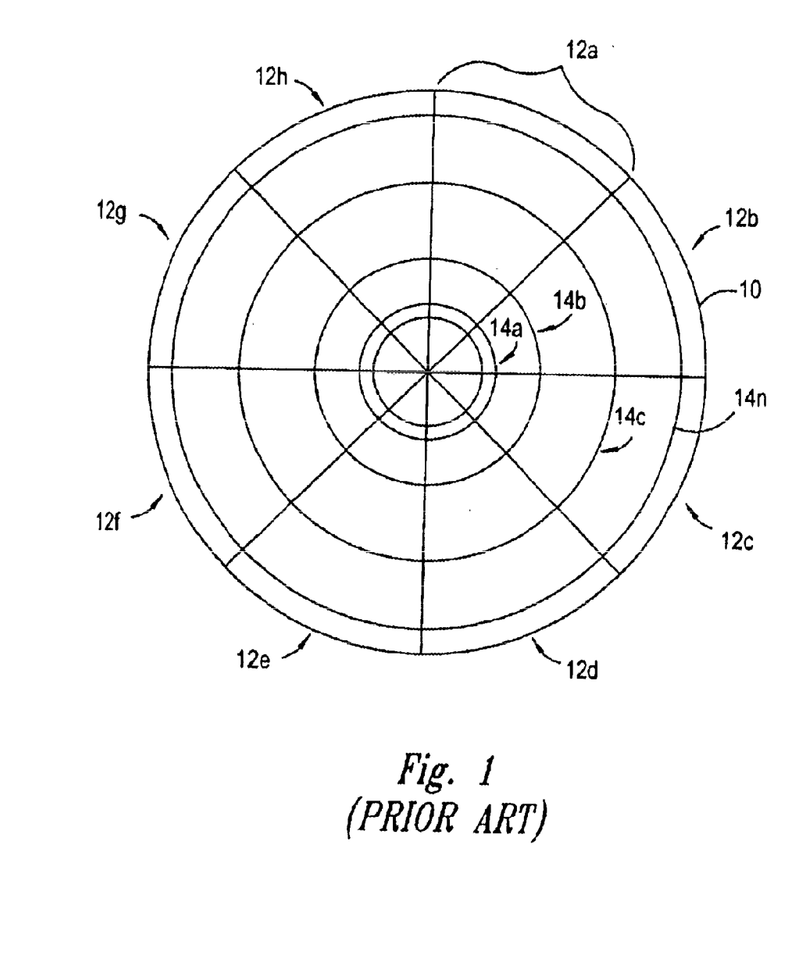
FIG. 1 is a plan view of a conventional magnetic data-storage disk having disk sectors and data tracks.

FIG. 1 is a plan view of a conventional magnetic data-storage disk 10. The disk 10 is partitioned into a number—here eight—of disk sectors 12a–12h, and includes a number—typically in the tens or hundreds of thousands—of concentric data tracks 14a–14n. File data is stored in respective data sectors (not shown) within each track 14. Although the disk 10 is described as having eight disk sectors 12a–2h, it may have more or fewer disk sectors 12.

Figure 2:
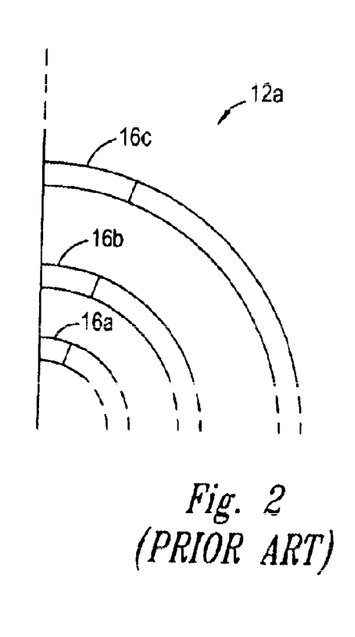
FIG. 2 is a close-up view of the servo wedges of the disk of FIG. 1.

Referring to FIG. 2, respective servo wedges 16 are located within each track 14 at the beginning of each disk sector 12. For clarity, only servo wedges 16a–16c are shown, it being understood that the other servo wedges are similar. The servo wedges 16 contain respective servo data that allows a head position system (FIG. 11) to position a read-write head (FIGS. 4 and 5) over the track 14 to be read from or written to. The manufacturer of a disk drive (FIG. 11) containing the disk 10 typically writes the servo wedges 16 onto the disk 10 before shipping the disk drive to a customer; neither the disk drive nor the customer alters the servo wedges 16 thereafter.

Figure 3:
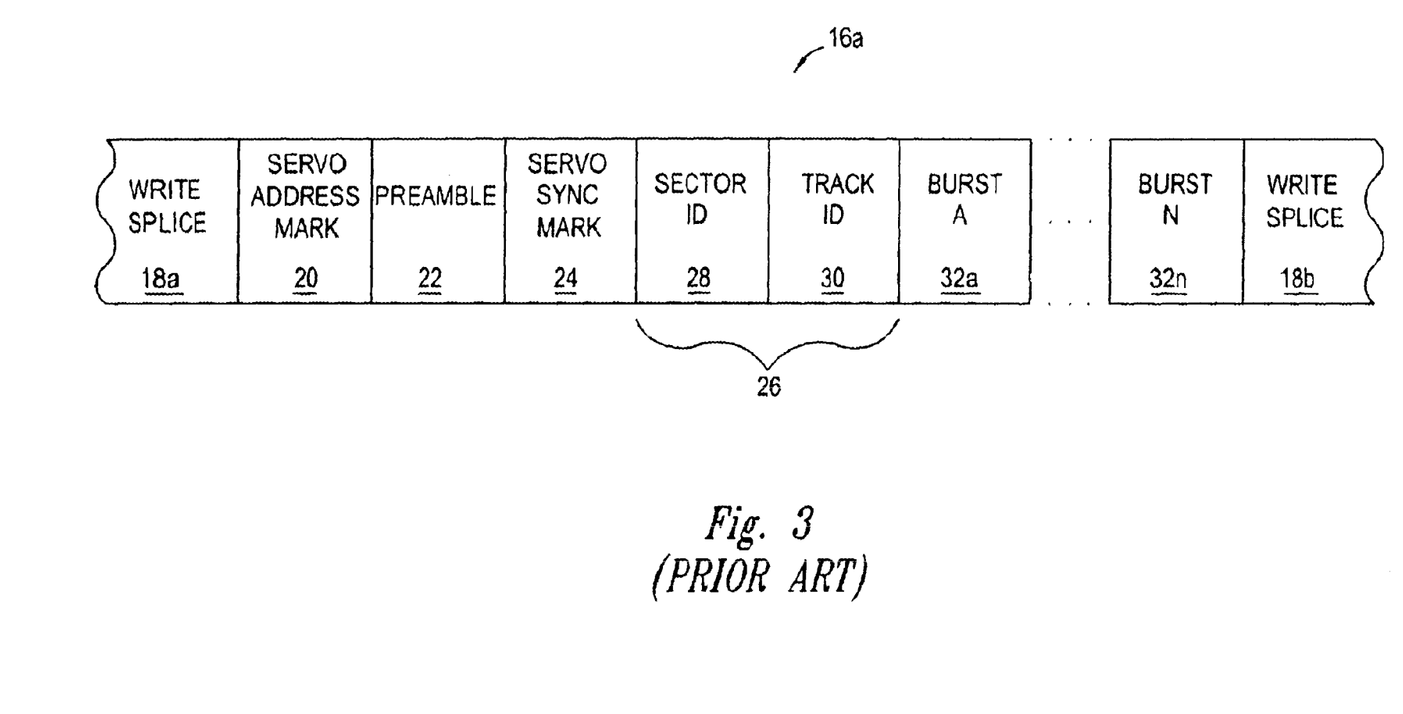
FIG. 3 is a diagram of a servo wedge of FIG. 2.

FIG. 3 is a diagram of the servo wedge 16a of FIG. 2, it being understood that the other servo wedges 16 are similar. Write splices 18a and 18b respectively separate the servo wedge 16a from adjacent data sectors (not shown). A servo address mark (SAM) 20 indicates to the head position system that the read-write head is at the beginning of a servo wedge 16, and thus at the beginning of a disk sector 12. A servo preamble 22 synchronizes the sample clock of a servo channel (FIGS. 4 and 5), and a servo synchronization mark (SSM) 24 identifies the beginning of a head-location identifier 26. A data preamble and a data synchronization mark, which are sometimes similar to the servo preamble 22 and the SSM 24, respectively, are discussed in U.S. patent application Ser. No. 09/410,274, filed Sep. 30, 1999, which is incorporated by reference. The location identifier 26 allows the head position system to coarsely determine and adjust the position of the read-write head with respect to the surface of the disk 10. More specifically, the location identifier 26 includes a sector identifier 28 and a track identifier 30, which respectively identify the disk sector 12—here the sector 12a—and the data track 14—here the track 14a—that contain the servo wedge 16a. Because the read-write head may read the location identifier 26 even if the head is not directly over the track 14a, the servo wedge 16a also includes bursts 32a–32n, which allow the head position system to finely determine and adjust the position of the read-write head.

Figure 4:
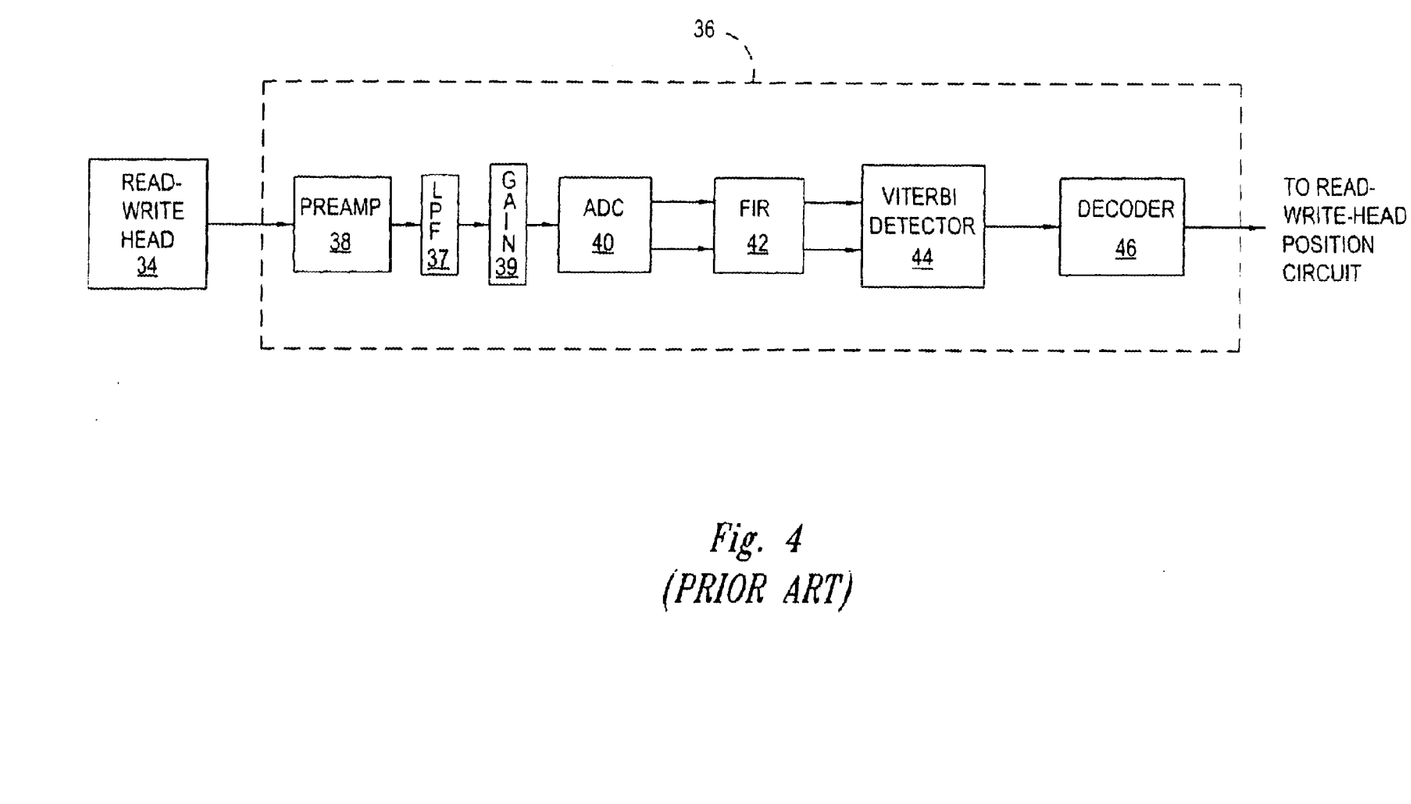
FIG. 4 is a block diagram of a conventional read channel for reading the servo wedges of FIGS. 2 and 3.

FIG. 4 is a block diagram of a conventional read-write head 34 and a read channel 36, which recovers the location identifier 26 from the servo wedges 16 of FIGS. 2 and 3 and provides the recovered identifier to the head position system. The channel 36 is typically used to recover both servo and read data, and thus functions as a servo channel while it is recovering servo data. Therefore, the channel 36 is hereinafter called servo channel 36.

The servo channel 36 includes a preamplifier 38, a continous lowpass filter (LPF) 37, a gain stage 39, an analog-to-digital converter (ADC) 40, a finite-impulse-response (FIR) filter 42, a Viterbi detector 44, and a decoder 46. The head 34 converts the bit sequence that composes the servo wedge 16 into a servo signal, and the preamplifier 38 amplifies the servo signal. The LPF 37 equalizes the servo signal, the gain stage 39 amplifies the signal so as to control the overall gain of the channel 36, the ADC 40 samples and digitizes the amplified signal, and the FIR filter 42 boosts the power of the signal to better equalize consecutive digitized samples—here two samples at a time—to the target polynomial (e.g., PR4) of the channel 36. The Viterbi detector 44, which is designed for the target polynomial, recovers the servo bit sequence from the servo signal by processing the equalized samples—here two samples at a time. The decoder 46 decodes the recovered bit sequence and provides the decoded bit sequence to the head position system. Alternatively, if the servo bit sequence is not coded, then the decoder 46 may be omitted such that the Viterbi detector provides the recovered bit sequence directly to the head position system. Other circuit blocks, which are omitted from FIG. 3 for clarity, detect the SAM 20 and the SSM 24 (FIG. 3) and control the timing and other characteristics of the channel 36.

Referring to FIGS. 1 and 4, the storage capacity of the disk 10 is typically limited by its surface area and the minimum servo-signal SNR specified for the Viterbi detector 44. Specifically, the diameter of the disk 10, and thus its surface area, are typically constrained to industry-standard sizes. Therefore, the option of increasing the surface area of the disk 10 to increase its storage capacity is usually unavailable to disk-drive manufacturers. Furthermore, the SNR of the servo signal is a function of the servo-data-storage density on the surface of the disk 10; the higher the storage density, the lower the SNR of the servo signal, and vice-versa. Typically, as the SNR of the servo signal decreases, the number of errors that the Viterbi detector 44 introduces into the recovered servo data increases. Unfortunately, an increase in the number of errors may degrade the effective servo-data-recovery speed of a disk drive to unacceptable levels.

One way to increase the data-storage capacity of the disk 10 is to decrease radial distance, i.e., the pitch, between adjacent data tracks 14. This allows the manufacturer to fit more tracks 14, and thus more data, onto the disk 10.

Unfortunately, decreasing the pitch of the data tracks 14 often decreases the SNR of the servo signal by increasing the inter-symbol interference (ISI) and media noise during reading of the servo data. ISI, media noise, and the affect ISI and media noise have on the SNR of a data read signal such as the servo signal are discussed in U.S. patent application Ser. No. 09/409,923, entitled "PARITY-SENSITIVE VITERBI DETECTOR AND METHOD FOR RECOVERING INFORMATION FROM A READ SIGNAL", filed Sep. 30, 1999, which is incorporated by reference.

Furthermore, the servo channel 36 may effectively decrease the SNR of the servo signal by heavily equalizing the digitized samples of the signal to a target power spectrum and corresponding target polynomial (e.g., EPR4) that the servo signal does not fit well. The Viterbi detector 44 is often designed for a target polynomial (e.g., EPR4) that requires the FIR filter 42 to heavily equalize the digitized samples of the servo signal so that the filtered samples "fit" the target power spectrum represented by the target polynomial. For example, this may occur when the Viterbi detector 44 is used to recover both servo and read data. Because the storage density of the servo data in a track 14 is typically less than the storage density of the read data within the same track, the servo-data field requires different equalization than the read-data field. For reasons that are omitted here for brevity, this different equalization is often required because the power spectrum of the read signal may be quite different than the power spectrum of the servo signal. Therefore the channel 36 is typically constructed to target the power spectrum of the read data, not the servo data. If one equalizes the servo signal to force it to have the same power spectrum as the read signal, then this equalization typically enhances the noise at the frequencies where there is no signal power for the servo signal. Thus, such equalization often introduces a relatively high level of equalization noise into the filtered samples, thus effectively increasing the noise component, and decreasing the SNR, of the servo signal.

Consequently, the servo channel 36 limits the servo-data-storage density, and thus thedata-storage capacity, of the disk 10. Specifically, the servo-data-storage density of the disk 10 must be low enough such that the total effective SNR of the servo signal (the SNR of the servo read signal reduced by the equalization noise) is greater than or equal to the minimum SNR required by the Viterbi detector 44. Therefore, the higher the level of equalization performed by the servo channel 36 and the higher the minimum SNR required by the Viterbi detector 44, the lower the servo-data-storage density of the disk 10 must be.

SUMMARY OF THE INVENTION

In accordance with an embodiment of the invention, a Viterbi detector receives a signal that represents a binary sequence having groups of no more and no fewer than a predetermined number of consecutive bits each having a first logic level, where the groups are separated from each other by respective bits having a second logic level. The Viterbi detector recovers the binary sequence from the signal by calculating a respective path metric for each of no more than four possible states of the binary sequence, and determining a surviving path from the calculated path metrics, where the binary sequence lies along the surviving path. In a related embodiment, the Viterbi detector recovers the binary sequence from the signal by calculating respective path metrics for possible states of the binary sequence, calculating multiple path metrics for no more than one of the possible states, and determining the surviving path from the calculated path metrics.

For a binary sequence coded according to a Gray code coding scheme, such a Viterbi detector can accurately recover the coded binary sequence from a servo signal having an effective SNR that is significantly lower than the minimum SNR required by prior Viterbi detectors. Furthermore, the sampled servo signal can be equalized to a target power spectrum (e.g., PR4) that fits the power spectrum of unequalized servo data being read, and thus can operate with a lower level of equalization than prior servo-data detection schemes require. More specifically, a PR4 Viterbi detector is pruned to match the Gray coded coding scheme, thereby increasing the minimum Euclidian distance of the error events. In addition, the servo channel that incorporates the Viterbi detector equalizes the servo signal to a target PR4 power spectrum, which is the same or approximately the same as the power spectrum of the servo data. Thus, this equalization does not increase the noise power of the servo signal as much as an equalization to another target power spectrum (e.g., EPR4) that is different than the servo-data power spectrum.

Therefore, such a Viterbi detector in such a servo channel can recover servo data from a disk having a higher servo-data-storage density than other Viterbi detectors in other servo channels can tolerate.

DESCRIPTION OF THE INVENTION

Figure 5:
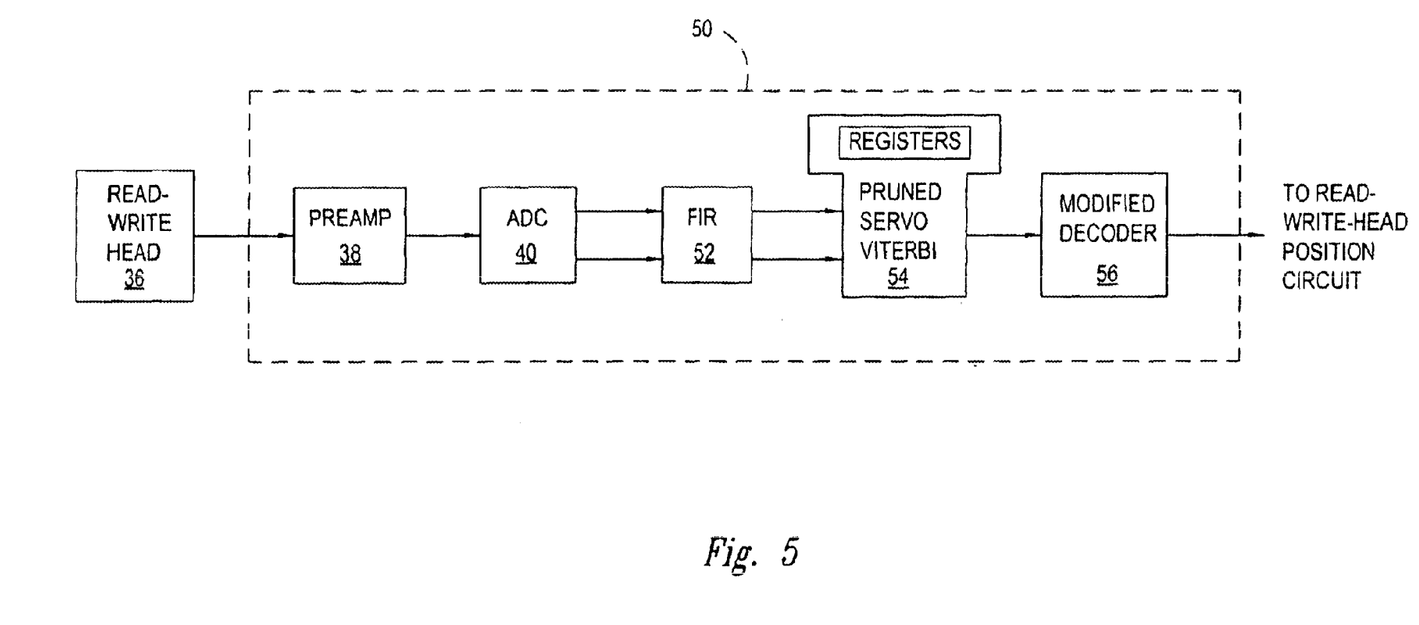
FIG. 5 is a block diagram of a servo channel for reading servo wedges according to an embodiment of the invention.

FIG. 5 is a block diagram of a servo channel 50 according to an embodiment of the invention, where like reference numerals identify components that are common to both the servo channel 50 and the servo channel 36 of FIG. 4. More specifically, the servo channel 50 uses the same front end (preamplifier 38, LPF 37, gain stage 39, and ADC 40) as the servo channel 36 of FIG. 4, but uses a different FIR, Viterbi detector, and decoder. For clarity, the LPF 37 and gain stage 39 are omitted from FIG. 5.

The servo channel 50 often allows a servo signal to have an SNR that is lower than the servo channel 36 (FIG. 4) allows, and thus often allows a disk such as the disk 10 (FIG. 1) to have a higher data-storage capacity than the channel 36 allows. More specifically, the servo data that composes the servo wedges 16 (FIGS. 2 and 3) has a power spectrum that depends on the density of the servo data and the rotational speed of the disk. Consequently, the servo channel 50 includes an FIR filter 52 for equalizing the servo-signal samples to a target power spectrum that is the same as or close to the power spectrum of the servo data, and includes a Viterbi detector 54 constructed for the polynomial that represents this target power spectrum. In one embodiment, a PR4 power spectrum is the same or is close to the power spectrum of the servo data. Therefore, because the the target of the servo channel 50 is similar to the power spectrum of the servo data, the FIR filter 52 can provide a significantly lower level of equalization than it could if the servo-channel target was significantly different (e.g., EPR4) than the servo-data power spectrum. Therefore, lowering the equalization introduces less equalization noise into the servo-signal samples, and thus the channel 50 does not lower the effective SNR of the servo signal as much as the servo channel 36—which equalizes the servo data to a different target (EPR4)—lowers it. Furthermore, one can prune the Viterbi detector 54 to fit the coding scheme of the servo data, and thus can reduce the minimum servo-signal SNR required by the detector 54. Thus, by constructing the servo channel 50 to target a power spectrum—here the target power spectrum represented by a PR4 polynomial—that is similar to the servo-data power spectrum, and by pruning the Viterbi detector 54 to fit the servo-data coding scheme, one can significantly decrease the minimum servo-signal SNR that the channel 50 requires, and thus can significantly increase the servo-data storage density, and thus the data-storage capacity, of the disk.

In operation, the servo channel 50 reads the servo data from a disk and provides the sector and track identifiers to the head position system, which uses this information to properly position the read-write head 34 with respect to the disk surface. The read-write head 34, the preamplifier 38, and the ADC 40 operate as discussed above in conjunction with FIG. 4. The FIR filter 52 equalizes consecutive digitized samples—here two samples at a time—to the target polynomial, which is a PR4 polynomial in one embodiment. The Viterbi detector 54 recovers the servo bit sequence from the servo read signal by processing the equalized samples—here two samples at a time—and stores the recovered bit sequence in one or more registers 56. A decoder 58 decodes the recovered bit sequence, which, in one embodiment, is coded as discussed below in conjunction with FIGS. 6 and 9, and provides the decoded bit sequence to the head position system. Other circuit blocks, which are omitted from FIG. 5 for brevity, detect the SAM 20 and the SSM 24 (FIG. 3) and control the timing, gain (e.g., gain stage 39 of FIG. 4), and other characteristics of the channel 50.

Figure 6:
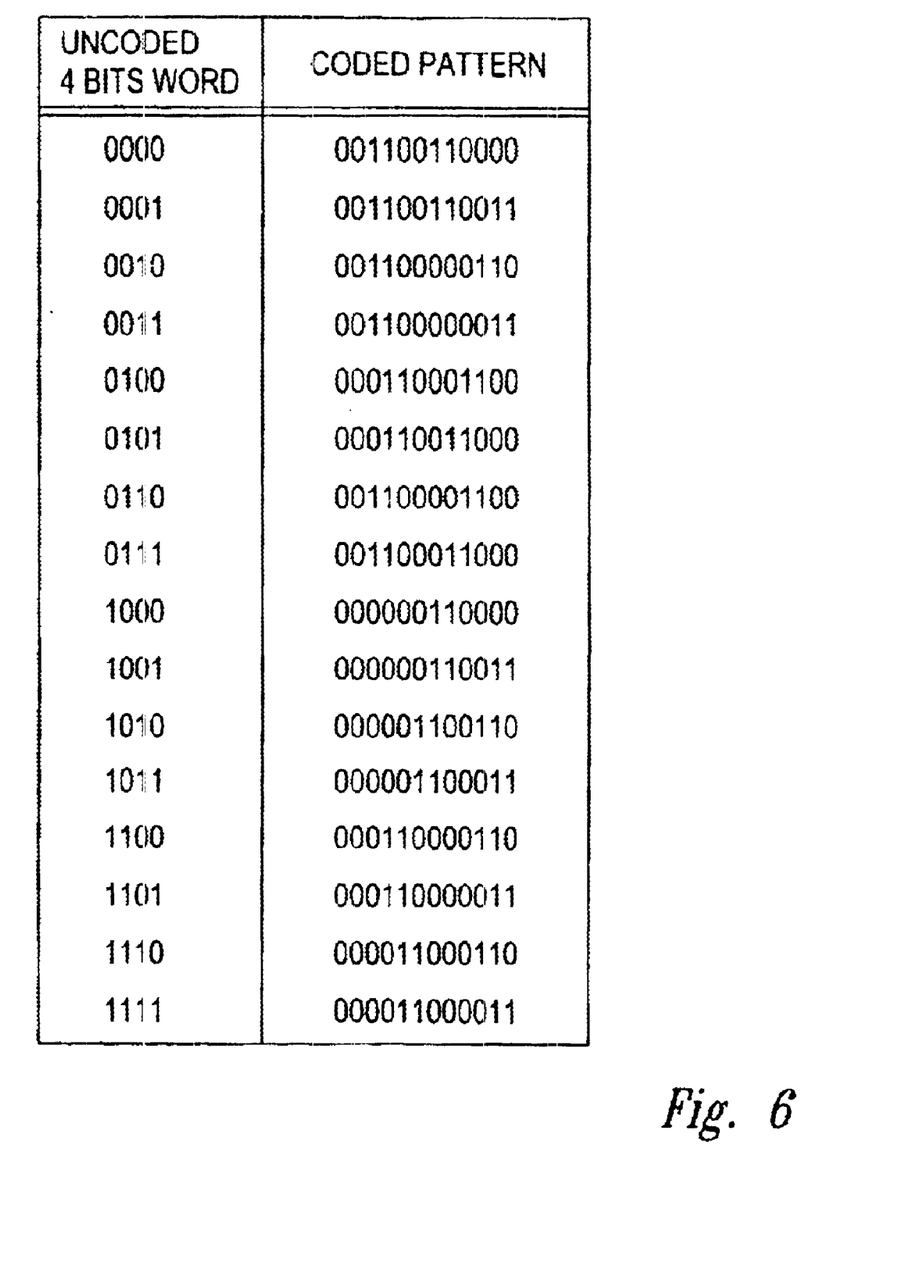
FIG. 6 is a chart of uncoded words and corresponding coded words used to encode servo data code for coding according to an embodiment of the invention.

FIG. 6 is a chart of uncoded words and corresponding Gray code coding words that code the servo data within the servo wedges 16 (FIGS. 2 and 3) according to an embodiment of the invention. The Gray code coding scheme is a 4:12 run-length-limited (RLL) code having d=2, k=10, and having single pairs and only single pairs of logic 1's. That is, each consecutive set of four uncoded bits is coded as a respective twelve-bit coding word having a minimum of two and a maximum of ten logic 0's are between consecutive single pairs of logic 1's. Furthermore, as discussed below in conjunction with FIGS. 9, 10A, and 10B, when the read-write head 34 is between data tracks 14 (FIGS. 1 and 2), this Gray code coding scheme allows the servo signal to provide accurate head-position information to the head position system. This Gray code coding scheme is further discussed in U.S. patent application Ser. No. 09/087,364, which is heretofore incorporated by reference.

Figure 7:
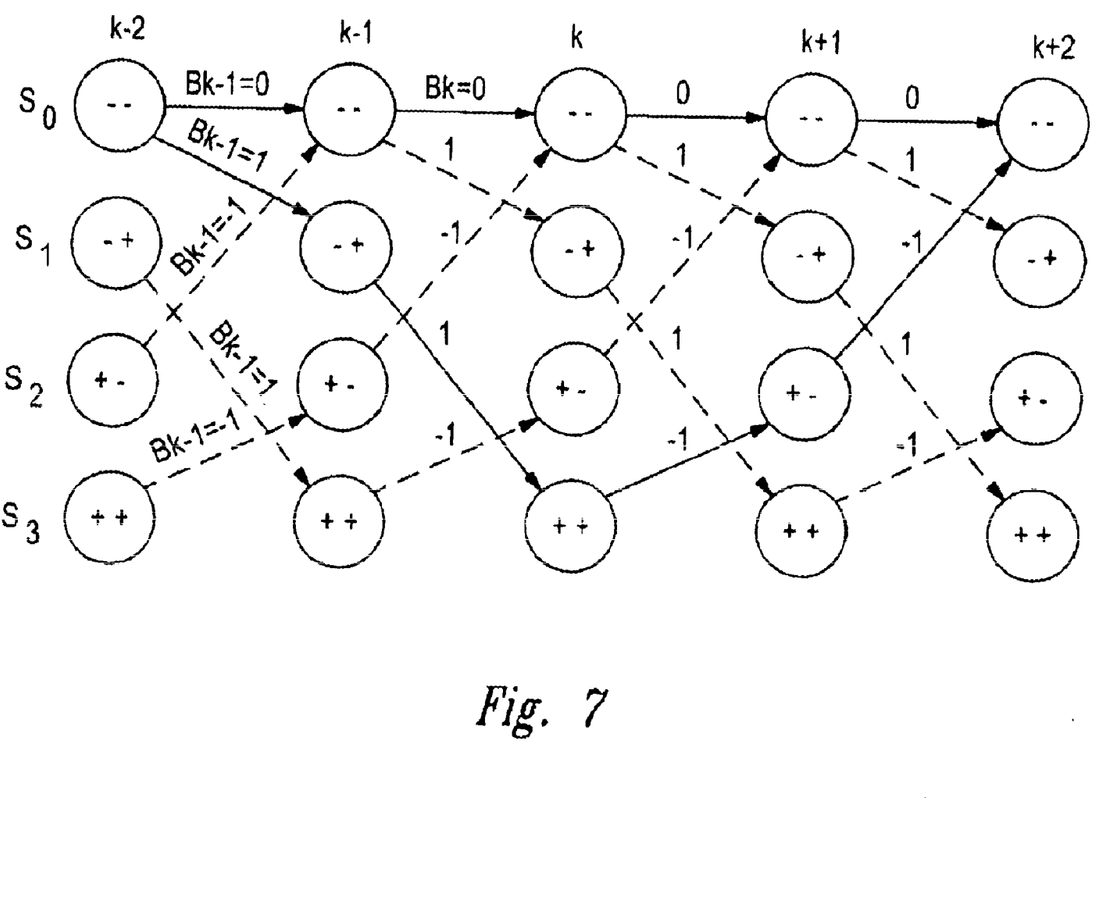
FIG. 7 is a one-sample-at-a-time trellis diagram for the Viterbi detector of FIG. 5 according to an embodiment of the invention.

FIG. 7 is a pruned trellis diagram that illustrates the operation of the Viterbi detector 54 (FIG. 5) according to an embodiment of the invention. The Viterbi detector 54 is constructed for a PR4 target polynomial $B_k=A_k-A_{k-2}$, where $B_k$ is the digitized sample of the servo signal at sample time k, $A_k$ is the logic value (0 or 1) of the sampled bit of the coded sequence at sample time k, and $A_{k-2}$ is the logic value of the sampled bit of the coded sequence at sample time k–2. Therefore, the trellis has four states that represent four possible states of the coded sequence: S0 (00 or ––), S1 (01 or –+), S2 (10 or +–), and S3 (11 or ++). Because the Gray coded servo data is constrained as discussed above in conjunction with FIG. 6, the Viterbi detector 54 can be "pruned" such that the number of branches between the states S0–S3 at consecutive sample times k is reduced from eight branches (two branches per state S0–S3) to five branches. Thus, only the state S0 has more than one—here two—incoming branches. The combination of the servo data being constrained according to the Gray code coding scheme and the Viterbi detector 54 being pruned to match the coding scheme increases the minimum squared distance error by a factor of two with respect to a combination of uncoded servo data and a full-state (eight branches) Viterbi detector. This increase in the minimum squared distance reduces by 6 dB the minimum servo-signal SNR required by the detector 54, and thus makes recovery of the servo data more reliable for a given servo-signal SNR. The minimum squared distance event, i.e., the only possible trellis path that the Gray coded servo data can follow, is shown in solid line. Viterbi detectors and trellis diagrams are further discussed in U.S. patent application Ser. No. 09/409,923, entitled "PARITY-SENSITIVE VITERBI DETECTOR AND METHOD FOR RECOVERING INFORMATION FROM A READ SIGNAL", and U.S. patent application Ser. No. 09/410,274, entitled "CIRCUIT AND METHOD FOR RECOVERING SYNCHRONIZATION INFORMATION FROM A SIGNAL", which are heretofore incorporated by reference.

Figure 8:
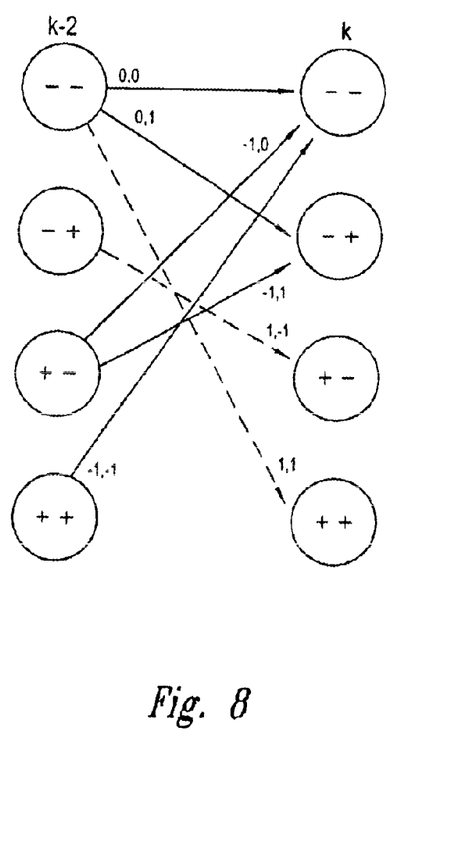
FIG. 8 is a two-sample-at-a-time trellis diagram for the Viterbi detector of FIG. 5 according to an embodiment of the invention.

FIG. 8 is the pruned trellis diagram of FIG. 7 modified to reflect the Viterbi detector 54 (FIG. 5) processing two samples of the servo signal at a time. Therefore, each branch represents two sample values. For example, "1,–1" indicates that $B_{k-1}=1$ and $B_k=-1$. The dashed branch lines indicate that the transitions to states (+,–) and (+,+) are forced, i.e., there is only one respective state from which each of these transitions can originate.

Figure 9:
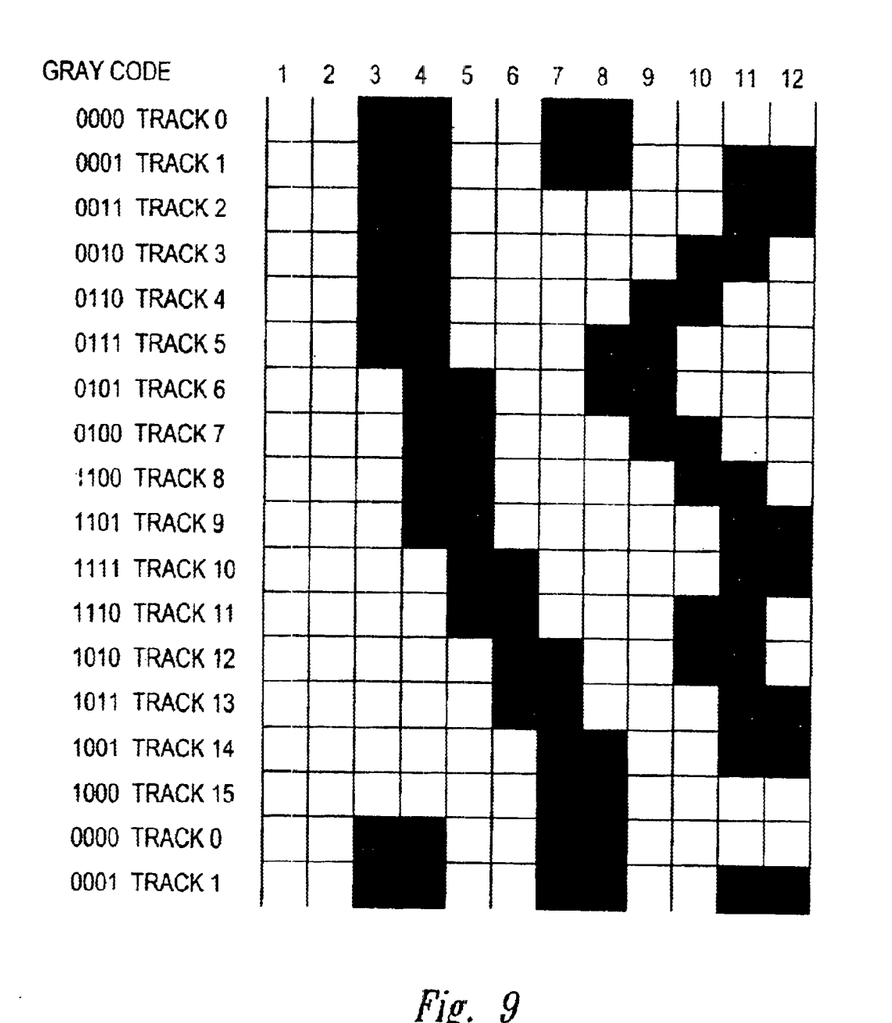
FIG. 9 is a diagram of the servo-data Gray codes and the corresponding magnetization patterns for adjacent data tracks according to an embodiment of the invention.

FIG. 9 is a diagram of the magnetization patterns corresponding to the 12-bit Gray code coding words stored in the track ID sections of the servo wedges for eighteen adjacent tracks 14 according to an embodiment of the invention. As discussed below in conjunction with FIGS. 10A and 10B, the Gray code coding scheme of FIG. 6 allows the head position system to identify the track over which the read-write head 34 (FIG. 5) is located within +/−1 track, even if the head 34 is positioned between tracks. To obtain this result, the Gray code coding scheme constrains code changes between adjacent tracks 14 to either a 1-bit shift in the position of a pair of logic 1's, replacement of a pair of 1's with a pair of logic 0's, or replacement of a pair of 0's with a pair of 1's. For example, the only change in the code words between tracks 1 and 2 is that bits 7 and 8, which are logic 1's in track 1, are replaced with logic 0's in track 2. Similarly, the only change between tracks 2 and 3 is that bits 11 and 12, which are 1's in track 2, are "shifted left" such that that bits 10 and 11 are logic 1's in track 3.

Figure 10A:
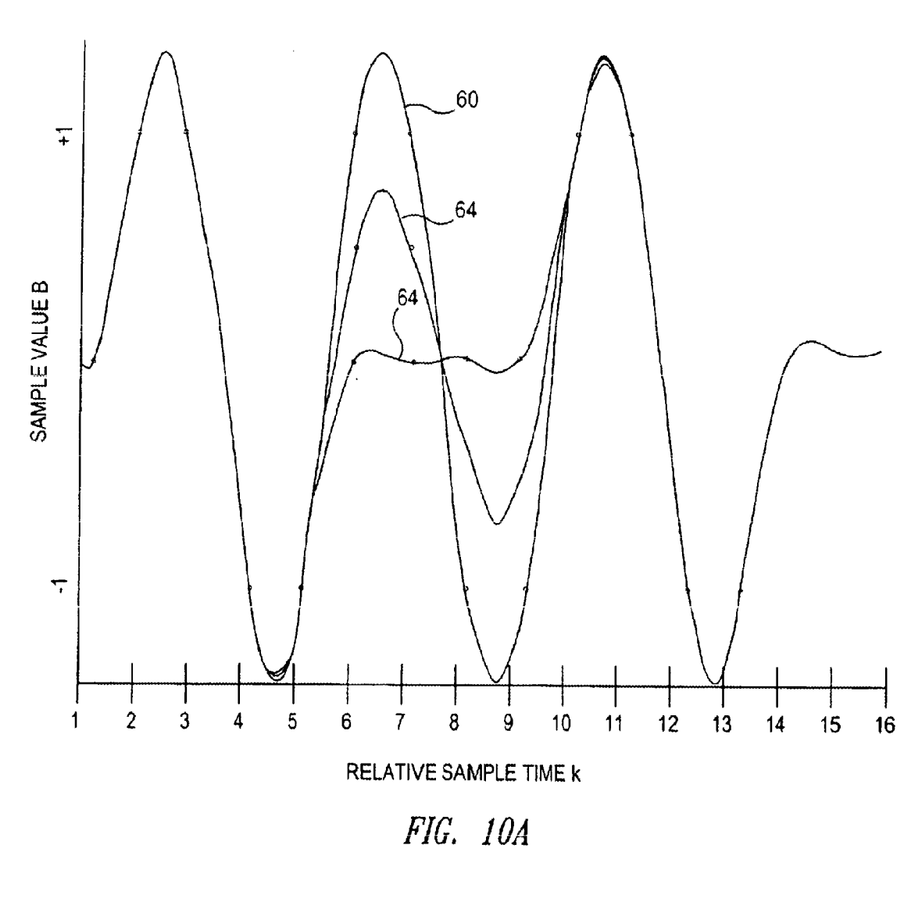
FIG. 10A is a plot of servo signals corresponding to read-head positions over and between first and second data tracks according to an embodiment of the invention.
Figure 10B:
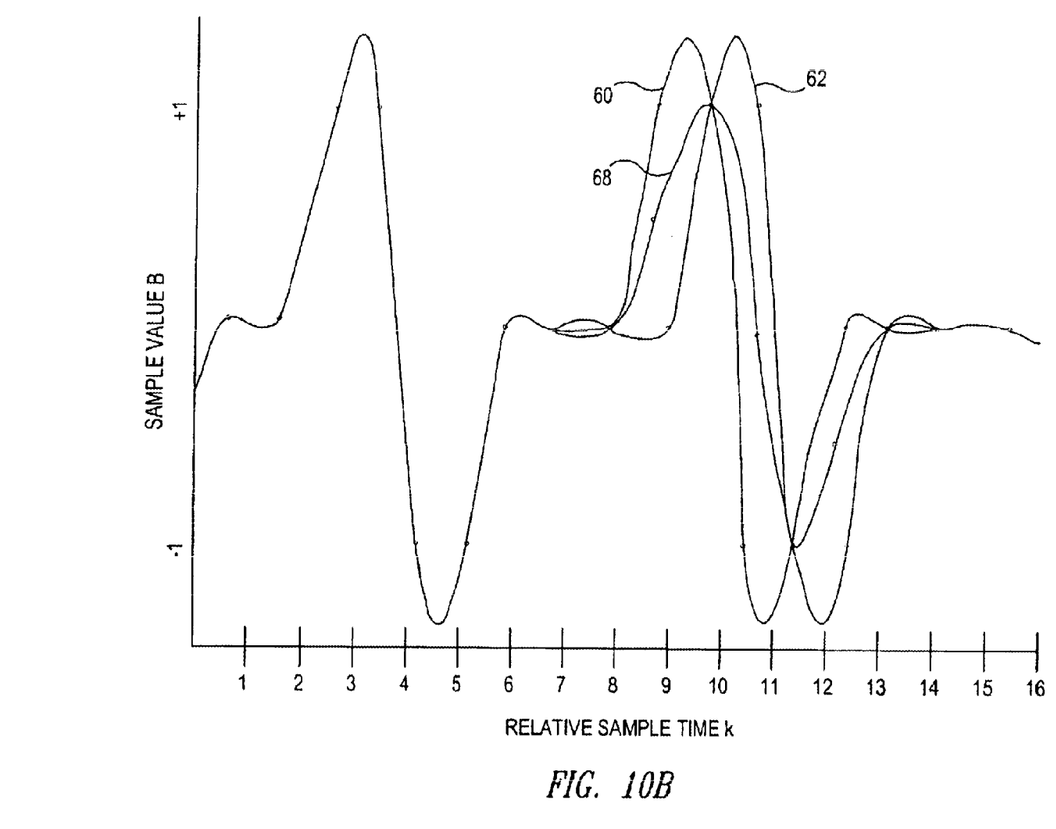
FIG. 10B is lot of servo signals corresponding to read-head positions over and between second and third data tracks according to an embodiment of the invention.

FIGS. 10A and 10B are plots of servo read signals corresponding to tracks 1–3 of FIG. 9 according to an embodiment of the invention. As discussed below, the magnetization patterns of FIG. 9 are such that if the read head 34 is in between two tracks 14, the Viterbi detector 54 recovers the code word corresponding to one of the two tracks. Consequently, the head position system can determine the location of the head 34 within +/−1 track.

FIG. 10A is a plot of servo signals corresponding to the head 34 being over track 1 or track 2 or in between tracks 1 and 2 of FIG. 9. For clarity, the servo signals are ideal, i.e., have no noise component (other than ISI). The y axis is the amplitude of the servo signal in units of the PR4 sample values −1, 0, and +1, and the x axis is time in units of the samples k of the servo signal. For example, sample time k=3 corresponds to the sample of the servo signal taken when the read head 34 is aligned with the third bit position (bit 3) of the Gray coded coding words stored in tracks 1 and 2 (FIG. 9). The head 34 generates the read signal 60 when it is directly over track 1. Similarly, the head 34 generates the read signal 62 when it is directly over track 2. And the head 34 generates the read signal 64 when it is halfway between tracks 1 and 2.

Still referring to FIG. 10A, because the magnetization patterns of tracks 1 and 2 are identical for bits 1–6, the signals 60, 62, and 64 are virtually identical from sample time k=2 to k=6. At sample times 7–10, the signals 60, 62, and 64 are different. Specifically, the signal 62 transitions from +1, +1 (samples 7 and 8) to −1, −1 (samples 9 and 10) due to bits 7 and 8 of track 1 being logic 1 and bits 9 and 10 being logic 0. Conversely, because bits 7–10 of track 2 are logic 0, there are no flux changes so the signal 62 levels out at 0. The signal 64 transitions from +0.5, +0.5 to −0.5, −0.5, and thus is halfway in between the signals 60 and 62. In actuality, the signal 64 is likely to be closer to one of the signals 60 and 62 than to the other. Therefore, the Viterbi detector 54 recovers the coding word associated with the track—track 1 or track 2 in this example—closest to the head 34. The head position system then uses the information provided by the bursts 32 (FIG. 3) in tracks 1 and 2 to precisely position the head 34 over the desired track—track 1 or track 2 in this example.

FIG. 10B is a plot of read signals corresponding to the head 34 being over track 2 or track 3 or in between tracks 2 and 3 of FIG. 9. The read signal 62—which is identical to the read signal 62 of FIG. 10A—is the signal that the head 34 generates when it is directly over track 2. Similarly, the head 34 generates the read signal 66 when it is directly over track 3. The head 34 generates the read signal 68 when it is halfway between tracks 2 and 3. As discussed above in conjunction with FIG. 10A, the Viterbi detector 54 recovers the coding word associated with the track—track 2 or track 3 in this example—closest to the head 34, and thus allows the head position system to locate the head 34.

Figure 11:
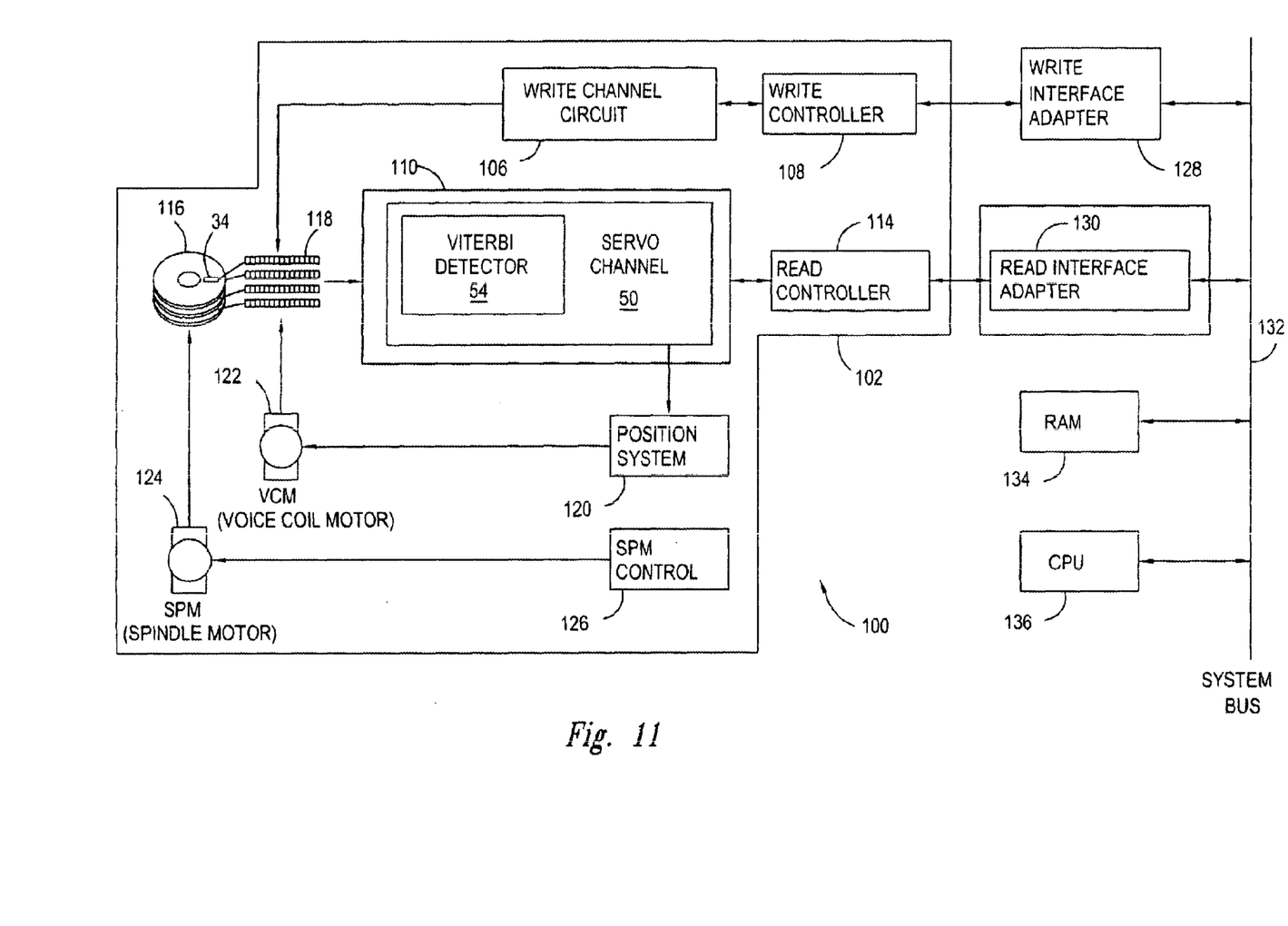
FIG. 11 is a block diagram of a disk-drive system that incorporates the servo channel of FIG. 5 according to an embodiment of the invention.

FIG. 11 is a block diagram of a disk-drive system 100 according to an embodiment of the invention. Specifically, the disk-drive system 100 includes a disk drive 102, which incorporates the servo channel 50 of FIG. 5. The disk drive 102 includes the read-write head 34, a write channel 106 for generating and driving the head 34 with a write signal, and a write controller 108 for interfacing the write data to the write channel 106. The disk drive 102 also includes a read channel 110 for receiving a read signal from the head 34 and for recovering data from the read signal, and includes a read controller 114 for organizing the read data. The read channel includes the servo channel 50, which receives the servo signal from the head 34, recovers the servo data from the servo signal, and provides the recovered servo data to a head position system 120. The disk drive 102 further includes a storage medium such as one or more disks 116, each of which may contain data on one or both sides. The head 34 writes/reads the data stored on the disks 116 and is connected to a movable support arm 118. The head position system 120 determines the position of the head 34 as discussed above in conjunction with FIGS. 9, 10A, and 10B, and provides a control signal to a voice-coil motor (VCM) 122, which positionally maintains/moves the arm 118 so as to positionally maintain/radially move the head 34 over the desired data tracks on the disks 116. A spindle motor (SPM) 124 and a SPM control circuit 126 respectively rotate the disks 116 and maintain them at the proper rotational speed.

The disk-drive system 100 also includes write and read interface adapters 128 and 130 for respectively interfacing the write and read controllers 108 and 114 to a system bus 132, which is specific to the system used. Typical system busses include ISA, PCI, S-Bus, Nu-Bus, etc. The system 100 also typically has other devices, such as a random access memory (RAM) 134 and a central processing unit (CPU) 136 coupled to the bus 132.

From the foregoing it will be appreciated that, although specific embodiments of the invention have been described herein for purposes of illustration, various modifications may be made without deviating from the spirit and scope of the invention.

What is claimed is:

1. A Viterbi detector, comprising:
   an input terminal operable to receive a signal that represents a binary sequence having groups of no more and no fewer than a predetermined number of consecutive bits each having a first logic level, the groups separated from each other by respective bits having a second logic level; and
   a recovery circuit coupled to the input terminal, the circuit operable to recover the binary sequence from the signal by,
      calculating a respective path metric for each of no more than four possible states of the binary sequence, and
      determining a surviving path from the calculated path metrics, the binary sequence lying along the surviving path.

2. The Viterbi detector of claim 1, further comprising:
   a register coupled to the recovery circuit; and
   wherein the recovery circuit is operable to load the recovered binary sequence into the register.

3. The Viterbi detector of claim 1 wherein the predetermined number equals two.

4. The Viterbi detector of claim 1 wherein:
the first logic level equals logic 1; and
the second logic level equals logic 0.

5. The Viterbi detector of claim 1 wherein the groups of consecutive bits are separated from each other by no more than ten and no fewer than two consecutive bits having the second logic level.

6. The Viterbi detector of claim 1 wherein the recovery circuit is operable to recover the binary sequence from the signal by calculating a respective path metric for four and only four possible states of the binary sequence.

7. The Viterbi detector of claim 1 wherein the recovery circuit is operable to recover the binary sequence from the signal by calculating a respective path metric for only possible binary states 00, 01, 10, and 11.

8. The Viterbi detector of claim 1 wherein the recovery circuit is operable to recover the binary sequence from the signal according to a PR4 protocol.

9. A Viterbi detector, comprising:
an input terminal operable to receive a signal that represents a binary sequence having groups of no more and no fewer than a predetermined number of consecutive bits each having a first logic level, the groups separated from each other by respective bits having a second logic level; and
a recovery circuit coupled to the input terminal and to the register, the circuit operable to recover the binary sequence from the signal by,
sampling the signal,
for each sample, calculating respective path metrics for possible states of the binary sequence,
for each sample, calculating multiple path metrics for no more than one of the possible states, and
determining a surviving path from the calculated path metrics, the binary sequence lying along the surviving path.

10. The Viterbi detector of claim 9, further comprising:
a register coupled to the recovery circuit; and
wherein the recovery circuit is operable to load the recovered binary sequence into the register.

11. The Viterbi detector of claim 9 wherein the recovery circuit is operable to recover the binary sequence from the signal by:
for each sample, calculating a respective path metric for four possible binary states of the binary sequence, the four possible binary states being 00, 01, 10, and 11; and
for each sample, calculating multiple path metrics for the possible binary state 00 and only the possible binary state 00.

12. The Viterbi detector of claim 9 wherein the recovery circuit is operable to recover the binary sequence from the signal by:
for each sample, calculating one respective path metric for each of the possible binary states 01, 10, and 11; and
for each sample, calculating two path metrics for the possible binary state 00.

13. A servo channel, comprising:
an input terminal operable to receive a signal that represents an encoded binary sequence having groups of no more and no fewer than a predetermined number of consecutive bits each having a first logic level, the groups separated from each other by a respective bit having a second logic level, the binary sequence identifying a location on a data-storage disk;
a sampling circuit for sampling the signal;
a Viterbi detector, comprising,
a register; and
a recovery circuit coupled to the sampling circuit and to the register, the circuit operable to recover the binary sequence from the signal by,
for each sample, calculating a respective path metric for each of no more than four possible states of the binary sequence,
for each sample, calculating multiple path metrics for no more than one of the possible states of the binary sequence,
determining a surviving path from the calculated path metrics, the binary sequence lying along the surviving path, and
loading the binary sequence into the register; and
a decoder coupled to the Viterbi detector and operable to decode the recovered binary sequence.

14. The servo channel of claim 13 wherein the decoder is operable to decode a set of twelve bits from the recovered binary sequence into a set of four bits.

15. The servo channel of claim 13 wherein the encoded binary sequence comprises a sequence of Gray coded code words.

16. The servo channel of claim 13, further comprising a filter coupled to the sampling circuit and to the Viterbi detector and operable to equalize the sampled signal to a PR4 power spectrum.

17. A disk-drive system, comprising:
a data-storage disk having a surface and operable to store location values that identify respective locations on the disk surface, the location values having groups of no more and no fewer than a predetermined number of consecutive bits each having a first logic level, the groups separated from each other by a respective bit having a second logic level;
a motor coupled to and operable to rotate the disk;
a read head operable to generate a read signal that represents the location values;
a read-head positioning assembly operable to move the read head over the surface of the disk; and
a Viterbi detector operable to receive the read signal and to recover a sequence of the location values by,
calculating a respective path metric for each of no more than four possible states of the sequence, and
determining a surviving path from the calculated path metrics, the sequence of location values lying along the surviving path.

18. A disk-drive system, comprising:
a data-storage disk having a surface and operable to store location values that identify respective locations on the disk surface, the location values having groups of no more and no fewer than a predetermined number of consecutive bits each having a first logic level, the groups separated from each other by a respective bit having a second logic level;
a motor coupled to and operable to rotate the disk;
a read head operable to generate a read signal that represents the location values;
a read-head positioning assembly operable to move the read head over the surface of the disk; and
a servo channel operable to sample the read signal and including a Viterbi detector operable to receive the read signal and to recover a sequence of the location values by,
for each sample, calculating respective path metrics for possible states of the binary sequence, for each sample, calculating multiple path metrics for no more than one of the possible states, and determining a surviving path from the calculated path metrics, the binary sequence lying along the surviving path.

19. A method, comprising:

calculating a respective path metric for each of no more than four possible states of a binary sequence having groups of no more and no fewer than a predetermined number of consecutive bits each having a first logic level, the groups separated from each other by a respective bit having a second logic level;

determining a surviving sequence from the calculated path metrics; and recovering the binary sequence from the surviving sequence.

20. The method of claim 19 wherein recovering the binary sequence comprises setting the recovered binary sequence equal to the surviving sequence.

21. The method of claim 19, further comprising calculating multiple path metrics for two and only two of the possible binary states.

22. The method of claim 19 wherein calculating a respective path metric comprises:

calculating one and only one path metric for possible binary states 01 and 11, respectively; and calculating multiple path metrics for possible binary states 00 and 01 and only possible binary states 00 and 01.

23. A method, comprising:

calculating respective path metrics for possible states of a binary sequence having groups of no more and no fewer than a predetermined number of consecutive bits each having a first logic level, the groups separated from each other by a respective bit having a second logic level;

sampling a signal that represents the binary sequence;

for each sample of the signal, calculating multiple path metrics for no more than one of the possible states;

determining a surviving sequence from the calculated path metrics; and recovering the binary sequence from the surviving sequence.

24. The method of claim 23 wherein:

calculating respective path metrics comprises calculating respective path metrics for no more than four possible states of the binary sequence; and calculating multiple path metrics comprises calculating multiple path metrics for no more than one of the no more than four possible states.

25. The method of claim 23 wherein:

calculating respective path metrics comprises calculating respective path metrics for no possible states of the binary sequence other than 00, 01, 10, and 11; and calculating multiple path metrics comprises calculating multiple path metrics for no possible state of the binary sequence other than 00.

26. The method of claim 23 wherein recovering the binary sequence comprises setting the recovered binary sequence equal to the surviving sequence.

27. The method of claim 23, further comprising equalizing the samples of the signal to a PR4 target.

28. A method, comprising:

receiving a signal that represents a coded binary sequence having groups of no more and no fewer than a predetermined number of consecutive bits each having a first logic level, the groups separated from each other by a respective bit having a second logic level, the binary sequence identifying a location on a data-storage disk;

sampling the signal;

calculating a respective path metric for each of no more than four possible states of the binary sequence;

for each sample, calculating multiple path metrics for no more than one of the possible states of the binary sequence;

determining a surviving sequence from the calculated path metrics; and recovering the binary sequence from the surviving sequence.

29. The method of claim 28 wherein recovering the binary sequence comprises setting the recovered binary sequence equal to the surviving sequence.

30. The method of claim 28, further comprising loading the recovered binary sequence into a register.

31. The method of claim 28 wherein:

the coded binary sequence is coded according to a Gray code; and each set of twelve bits of the coded binary sequence represents a set of four bits of a corresponding decoded binary sequence.

32. The method of claim 28, further comprising equalizing the samples of the signal to fit a PR4 polynomial.

* * * * *